United States Patent [19]

Martin

[11] Patent Number: 4,633,810
[45] Date of Patent: * Jan. 6, 1987

[54] APPARATUS FOR ACCURATELY REGISTERING A FIRST MEMBER AND A SECOND MEMBER IN AN INTERDEPENDENT RELATIONSHIP

[75] Inventor: Richard T. Martin, Goleta, Calif.

[73] Assignee: Applied Magnetics Corp., Goleta, Calif.

[ * ] Notice: The portion of the term of this patent subsequent to Jan. 8, 2002 has been disclaimed.

[21] Appl. No.: 417,676

[22] Filed: Sep. 13, 1982

Related U.S. Application Data

[62] Division of Ser. No. 304,066, Sep. 21, 1981, Pat. No. 4,372,248.

[51] Int. Cl.$^4$ ............................................. C23C 13/08
[52] U.S. Cl. .................................... 118/721; 118/715; 427/282; 29/464
[58] Field of Search ............... 118/720, 721, 504, 505, 118/715; 427/282; 29/464

[56] References Cited

U.S. PATENT DOCUMENTS

| 3,238,918 | 3/1966 | Radke et al. | 118/720 |
| 3,312,190 | 4/1967 | Bradshaw | 118/720 |
| 3,510,947 | 5/1970 | Tuccillo et al. | 32/32 |
| 3,669,060 | 6/1972 | Page et al. | 118/720 |
| 3,694,919 | 10/1972 | Lee et al. | 32/32 |
| 3,747,558 | 7/1973 | Harel | 118/721 |
| 4,036,171 | 7/1977 | Ramet | 427/259 X |
| 4,390,172 | 6/1983 | Gotman | 29/464 X |

FOREIGN PATENT DOCUMENTS 55-65040  5/1980  Japan ..................................... 29/464

OTHER PUBLICATIONS

Huntley et al. "Kinematr Mounts for Mask Alignment" IBM Tech. Disclosure Bulletin, vol. 21, No. 5, Oct. 1978, pp. 2024–2025.
Brewer et al. "App. for Depositing Thin Film Devices" IBM Tech. Disclosure Bulletin, vol. 21, No. 7, Dec. 1978, pp. 3016–3018.

Primary Examiner—Richard Bueker
Attorney, Agent, or Firm—Daniel J. Meaney, Jr.

[57] ABSTRACT

Apparatus for accurately registering a first member in an interdependent relationship to a second member including prealigned registration members selectively mounted on the second member and having a first elongated member which defines a primary registration point, a second elongated member which defines a different secondary registration point, which together define a line of rotation, a third elongated member which defines a tertiary registration point located at a point other than on the line of rotation wherein each of the elongated members are positioned in a predetermined pattern and reference registration members mounted on the first member having a first receiving member which defines a primary reference point which receives and engages the first elongated member superimposing the primary registration point on the primary reference point, a second receiving member defining a reference line segment which extends in a preselected direction wherein the second receiving member receives and engages the second elongated member superimposing the second registration point on the reference line to establish a secondary reference point thereon, and a third receiving member defining a reference plane segment which lies in a predetermined direction wherein the third receiving member receives and engages the third elongated member superimposing the third registration point onto the reference plane segment to establish a tertiary reference point and wherein the elongated members co-act interdependently with the receiving members to restrain lineal and rotational movement between the first member and the second member loaded against each other without redundancy of constraint is shown. A method for accurately registering a first member to a second member is also shown.

5 Claims, 31 Drawing Figures

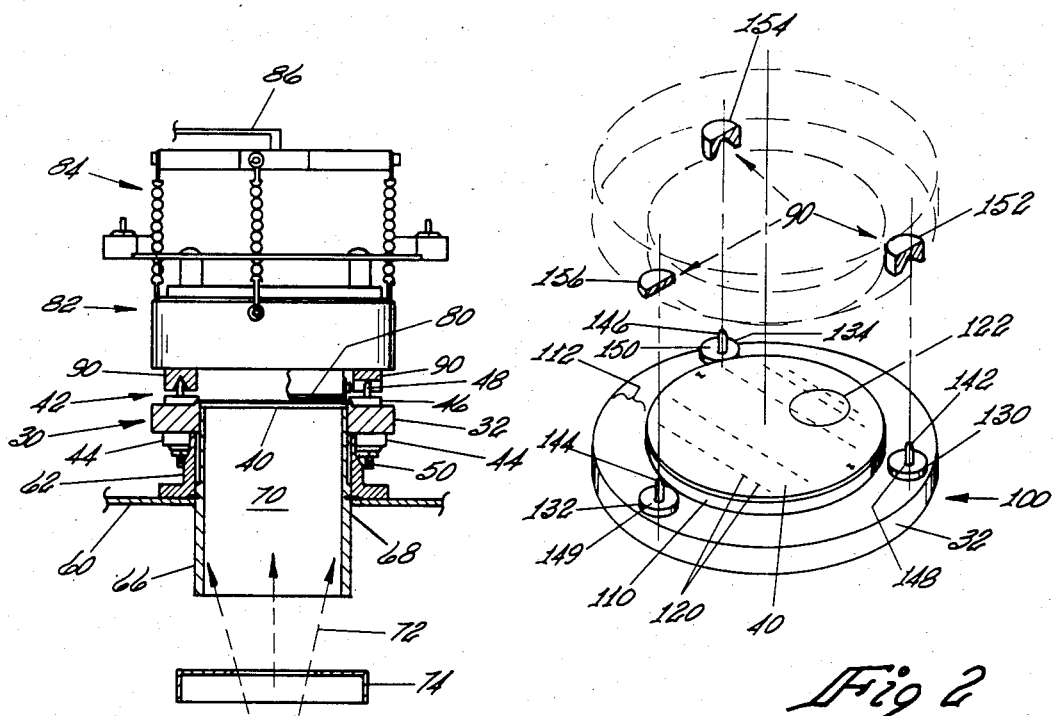
Fig 1
Fig 2
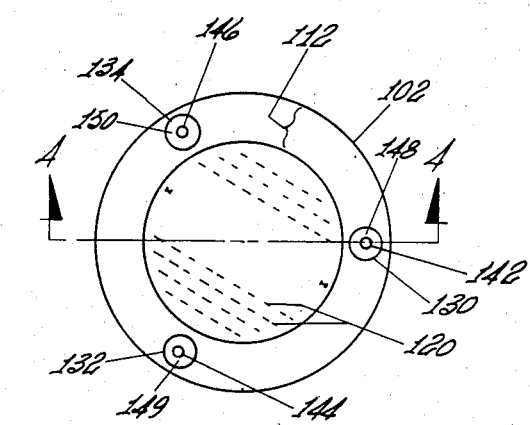
Fig 3
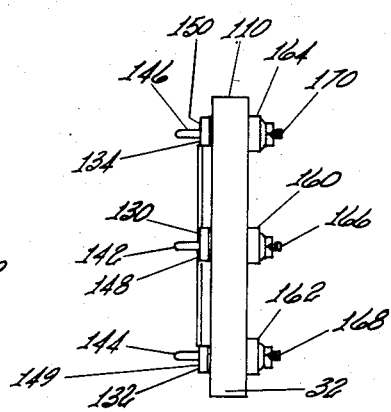
Fig 5
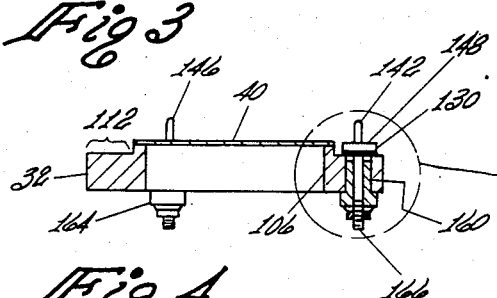
Fig 4
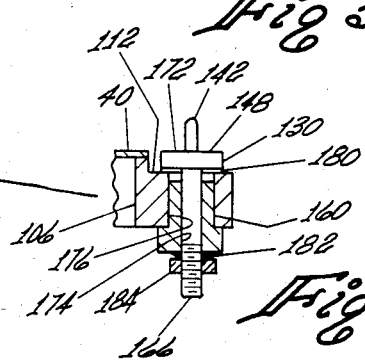
Fig 6

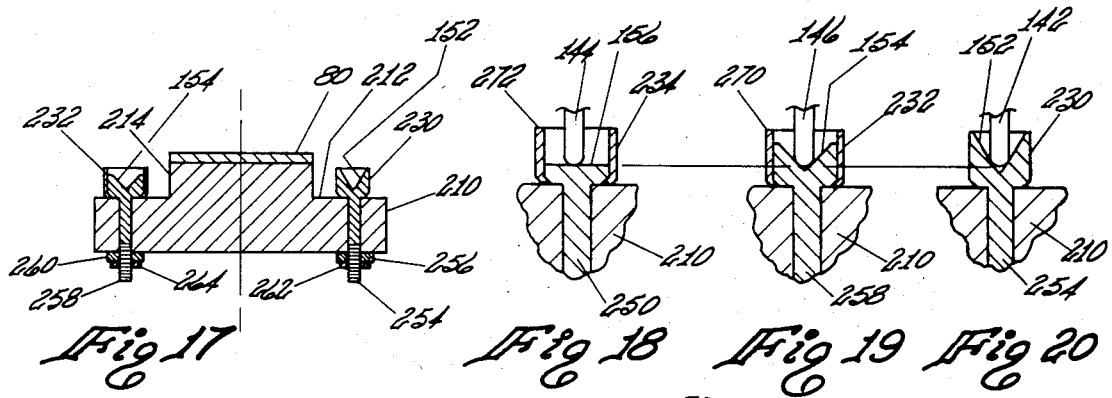
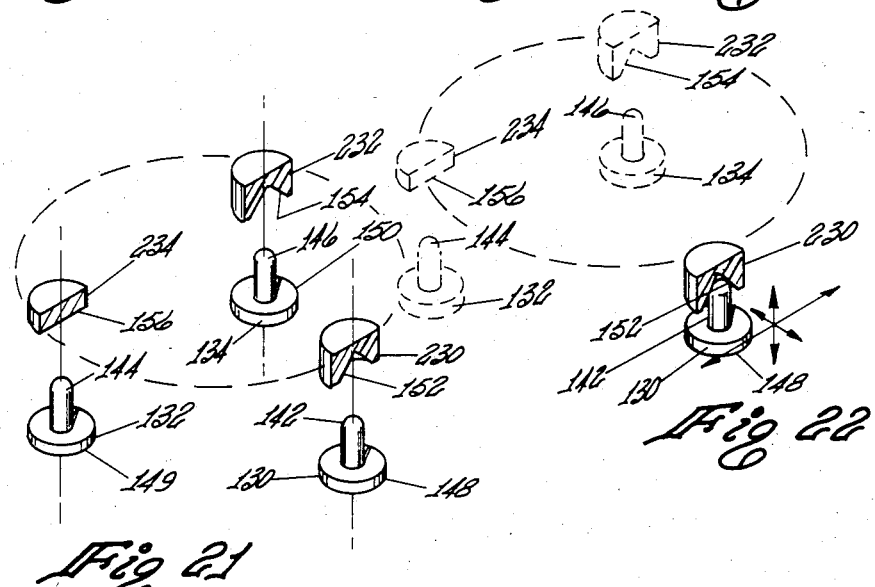
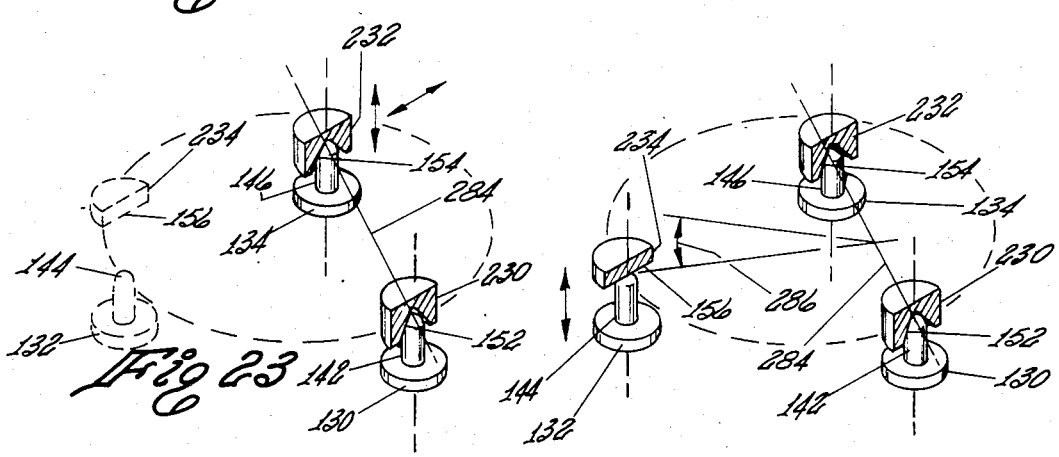

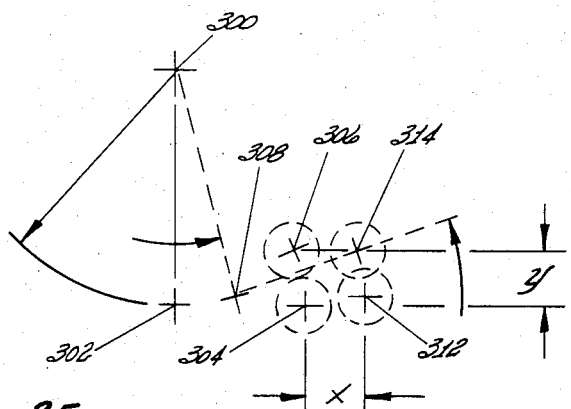
Fig 25
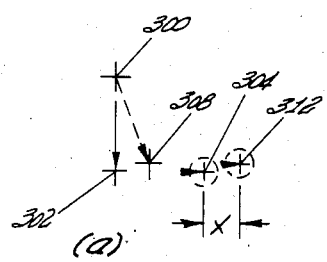
(a)
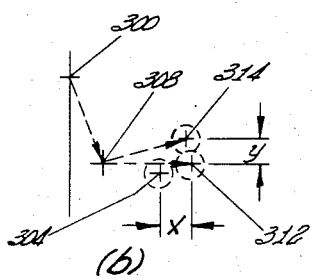
(b)
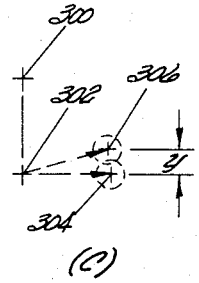
(c)
Fig 26
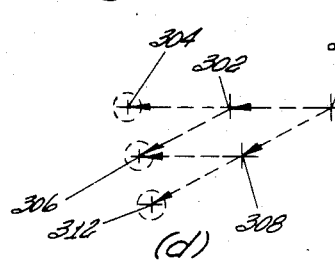
(d)
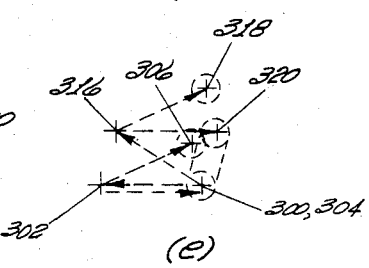
(e)
Fig 26
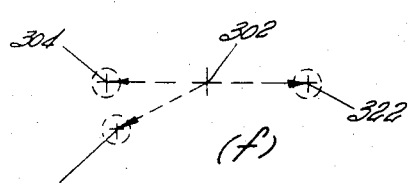
(f)
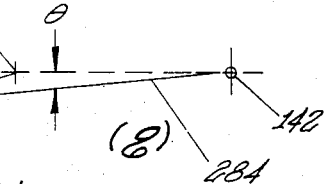
(g)
Fig 26
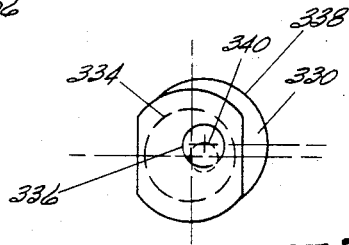
Fig 27

APPARATUS FOR ACCURATELY REGISTERING A FIRST MEMBER AND A SECOND MEMBER IN AN INTERDEPENDENT RELATIONSHIP

This is a division of application Ser. No. 304,066, filed Sept. 21, 1981, now U.S. Pat. No. 4,372,248.

BACKGROUND OF THE INVENTION

1. Field of the Invention

This invention relates to means for accurately registering a first member an interdependent relationship to a second member and more particularly to apparatus for accurately registering a reference member in a coacting interdependent relationship to one or more of a plurality of moveable members. The apparatus disclosed herein utilizes a three-point registration system utilizing a cone, vee groove and flat planar surface which cooperate with alignment pins having spherical shape ends to form a highly accurate mechanical registration means. This invention has particular utility in a vacuum thin film vapor deposition system for accurately registering a substrate to a series of deposition makes in a vapor deposition process.

2. Description of the Prior Art

The use of alignment pins and alignment pin receiving means are well known in the art as a means for registering a first member to a second member. Specifically, the use of a three-element pin and aperture alignment system for aligning a first member to a second member is disclosed in U.S. Pat. Nos. 3,694,919 and 3,510,947.

The apparatus disclosed in U.S. Pat. No. 3,694,919 is a dental articulator which utilizes a pair of simulated socket members and a rest pin as a means to register an upper assembly to a lower assembly. The simulated socket members each include a spherical stylus and a simulated socket which cooperates with the stylus to provide two pivot points which are adapted to provide a common axis about which a frame can be rotated. The rest pin is adapted to come into contact with a rest block on the lower assembly which provides a third point of support. The upper assembly is removable from the lower assembly by separating the rest pin from the block and the upper assembly from the two spherical shaped stylus members such that the simulated socket members can be removed from contact therewith which makes the upper assembly easily separable from the lower assembly which supports the two spherical shaped stylus members and the rest block. The upper assembly can be positioned back into registration with the lower assembly by placing the simulated socket members back onto the spherical shaped stylus members and then rotating the upper assembly relative to the common axis defined by the line of rotation extending between the centers of the spherical shaped stylus members until the rest pin on the upper assembly engages the rest block.

Another known three-element registration system for registering a first member in operative relationship to a second member is disclosed in U.S. Pat. No. 3,510,947 which is in the form of an interchangeable dental articulator. Stud members having alignment pins are cast into a base member in a predetermined pattern such that the alignment pins extend outwardly from the upper surface of the base member. The stud members comprise a collar of substantially cylindrical configuration having the alignment pins in the form of a cone shaped member defining an inverted frusto conical member extending coaxially therefrom positioned on one side and a similar shaped element extending from the other side thereof and into the base member. The second member, which may be a dental model, has three alignment pin and collar receiving holes formed in the bottom thereof in substantially the same pattern as the alignment pins positioned in the base member. An elastic or resilient, annular shaped member having an aperture extending through the center thereof is cast into the material forming the second member. The dental model can be positioned in operative relationship to the base member by positioning the apertures containing the annular shaped member over the alignment pin extending from the uppersurface of the base member and the dental model can be removably affixed to the base member by urging the dental model into engagement with the base member driving the alignment pin into engagement with and deforming the annular shaped member so that the collar can pass therethrough to maintain the dental model in position relative to the base. The dental model can be removed from the base by applying sufficient separation force between the dental model and the base to cause distortion of the annular member and to pull the column member through and further deforming the annular shaped member to permit separation thereof.

The use of a three-element apparatus for registering an optical diffraction grating member to a support for accurate mechanical registration as required is utilized in a scanning monochrometer known as the ARL-FICA Quantoscan which is offered for sale and sold by Applied Research Laboratories. The Quantoscan scanning monochrometer utilizes a diffraction grating which must be positioned in a vertical plane and located very accurately relative to two reflective members and two slits to provide a precise defraction pattern relative to a light source and detector. In using the Quantoscan scanning monochrometer, it is sometimes necessary to remove the grating member in order to clean the same or to otherwise maintain the apparatus. It is essential that the grating member be accurately positioned back onto its support so that repeatable readings can be obtained in a monochrometer. In order to obtain the accurate registration of the grating to the support, a three-element registration system is utilized which is formed of three ball elements which cooperate with a cone, vee groove and flat. The grating member contained alignment balls are adapted to cooperate with the cone, vee groove and flat which is located on the grating support. A spring support was connected between the grating member and a support to provide a positive clamping force onto the grating to urge the alignment balls into intimate engagement with the cone, vee groove and flat supports and to counteract the gravitational force acting on the vertically supported grating. Accurate alignment between the grating and other optical members was obtained by adjustment of the grating support carrying the cone, vee groove and planar member relative to the frame supporting the other optical members. Once the appropriate adjustment was obtained, the grating member could be removed by releasing the clamping force therefrom and could be cleaned or otherwise maintained. The grating member was capable of being reinstalled in a reproducible registration to the base by positioning the balls back into engagement with the cone, vee groove and flat surface and reattaching the spring member thereto.

Each of the above described prior art devices perform the function of engagement and registration of a first member with a second member in ambient atmosphere.

The use of a two-point support system for a magnetic head in a magnetic disk recording system is disclosed in U.S. Pat. No. 3,774,183. The two-point support system permits the head to exhibit movement in the form of pitch and roll only, while prohibiting yaw, as the head flies over the surface of a magnetic recording disk.

In the two-point support system, a pivot bar attached to a transducer has two apertures, one of which is generally circular in crossectional shape having inwardly sloping sidewalls to define a conical shaped surface and the other aperture which is generally elliptical in cross-sectional shape having inwardly sloping walls forming a conical shaped surface. Two pin members attached to compliant springs, each having a spherical end which is positioned one each in each one of the apertures, enables the transducer to roll and pivot but restricts lateral movement and yaw of the transducer.

It is also known in the art to utilize apparatus for registering a deposition mask to a substrate for producing thin film magnetic transducer using a vapor deposition process. One such technique is disclosed in U.S. Pat. No. 3,867,868 to Lazzari.

In fabrication of a thin film transducer having pole piece layers and one or more winding layers and insulation layers, any one of several techniques can be used in an attempt to precisely control the width, depth and registration of the various layers relative to the prior deposited and post deposited layers. The Lazzari apparatus utilized in fabricating such thin film transducers relies on the use of a rolling mask-carriage assembly positioned by a lead screw which functionally attempted to index and accurately position a specific deposition mask pattern relative to a substrate held by a pivoting arm.

In known vapor deposition processes, the use of pins, dowels or extending members in cooperation with apertures, which may either be cylindrical or elliptical in shaped, result in a high degree of friction being developed between the dowel pins and the receiving apertures which cooperate with the dowel pins. The high degree of friction is due to the fact that lubricants and surface contaminates are removed from the dowel pins and the inner walls defining the aperture. The contaminates include adsorbed gasses, lubricating contaminants, and the like which are removed from the surfaces of the engaging elements located in the chamber of the vacuum deposition apparatus by the pumping of the vacuum and the use of high temperatures typical of deposition processes.

In such alignment devices, clearance must be provided in order to permit engagement and disengagement of the apertures and cooperating alignment dowels or pins on members to be aligned. The amount of clearance directly affects the accuracy of registration of the registered members. Also, binding or siezing of the members can be experienced during engagement or disengagement of the apertures and cooperating alignment dowels or pins due to tilting or other angular misalignment between the members and due to discrepancies in center line distance between various interacting elements.

In a vacuum deposition process, it is known in the art that the coefficient of friction, both dynamic coefficient of friction and state coefficient of friction, are extremely high compared to ambient atmosphere conditions. This is due primarily to the high degree of atomic adhesion or binding which occurs between the surface of the components due to removal of a substantial portion of adsorbed gases and surface contamination.

SUMMARY OF THE INVENTION

This invention relates to a new, novel and unique means for accurately registering a first member in an interdependent relationship to a second member. In the accurate registration means of the present invention, prealigned registration means are operatively coupled to a second member. The prealigned registration means including three elongated means which are adapted to be positioned in a spaced relationship to each other and in a predetermined pattern on and extending generally in the same direction from the second member. One of the three elongated means is adapted to be selectively mounted on the second member and has a portion thereof defining a primary registration point. A second one of the three elongated means is adapted to be selectively mounted on the second member and has a portion thereof defining a secondary registration point which is other than said primary registration point. The primary registration point and the secondary registration point define a line of rotation. A third of the three elongated means is adapted to be selectively mounted on the second member and has a portion thereof defining a tertiary registration point which is located at a point other than on the line of rotation. Reference registration means are adapted to be operatively coupled to the first member which is to be accurately registered in an interdependent relationship to the second member. The reference registration means include three elongated means receiving means which are adapted to be positioned on and fixedly attached to the first member in substantially the predetermined pattern. A selected one of the three elongated means receiving means defines a primary reference point having three mutually orthogonal axes which define six independent degrees of freedom. The selected one of the three elongated means receiving means is adapted to receive and engage the one of the elongated means superimposing the primary registration point onto the primary reference point to establish a rotatable support therebetween which fixes lineal movement in all three mutually orthogonal axes between the primary registration point and the primary reference point, which is in engagement therewith, and which permits rotational movements in all three rotational degrees of freedom about the primary reference point. A selected second one of the three elongated means receiving means defines a reference line segment having a predetermined length and which extends in a direction other than in a direction which is perpendicular to a line extending radially from the primary reference point to any point located on the reference line segment. The selected second one of the three elongated means receiving means is adapted to receive and engage the second one of the elongated means superimposing the secondary registration point onto the reference line segment to establish a secondary reference point thereon which defines an axis of rotation between the primary reference point and the secondary reference point. The superimposing of the secondary registration point onto the reference line segment fixes lineal movement thereof in a plane perpendicular to the reference line segment at the secondary reference point, permits lineal movement along the reference line segment and permits rotational movements in all three rotational degrees of freedom at the secondary reference point. A selected third one of the three elongated means receiving means defines a reference plane segment having a predetermined extent and which lies in an orientation other than perpendicular to a line intersecting with and perpendicular to the axis of rotation and passing through any point on the reference plane segment. The selected third one of the third elongated means receiving means is adapted to receive and engage the third of the three elongated means superimposing the third registration point onto the reference plane segment to establish a tertiary reference point which fixes lineal movements thereof along an axis perpendicular to the reference plane segment and permits lineal movements along the reference plane segment and permits rotational movements in all three rotational degrees of freedom about the tertiary reference point. The reference registration means is adapted to receive and engage the prealigned registration means when the first member and the second member are loaded against each other enabling the elongated means to co-act interdependently with the elongated means receiving means to restrain lineal and rotational movements between the first member and the second member without redundancy of constraint in any of the six degrees of freedom to accurately register the first member relative to the second member.

As stated hereinbefore, the prior art mask-carriage assemblies, attempted to simultaneously index and accurately register one or more deposition masks to a substrate in a multistep deposition process requiring accurate registration between prior deposited and post deposited layers of thin film material. The inability of the mask-carriage assembly to accurately register a deposition mask or a selected one of a plurality of deposition masks to a substrate resulted in misregistration of the prior deposited and post deposited layers on a substrate requiring multiple thin film layers of material to be deposited thereon in a predetermined sequence in order to form a desired component.

In the apparatus disclosed in U.S. Pat. No. 3,694,919, the simulated socket members cannot be adjusted in the direction extending from the front to the rear of the support assembly to achieve full alignment. In addition, the two simulated socket members both appear to attempt to position the upper assembly relative to the lower assembly in a direction along the common axis through the balls resulting in an "overconstrained" support; that is, two different elements are in conflict in attempting to fix the location of the upper assembly in the direction described. Further, the spacing adjustment, or adjustment in a direction parallel to the rest pin, can be made only at the rest pin and the spacing is fixed at the socket members. If a precise registration between the upper assembly and the lower assembly is desired, the fit between the spherical stylus and socket would have to be very tight. However, the sockets do not appear to be tight, as discussed below, and are essentially custom fabricated for each patient. Further, in order to minimize lateral displacement along the common axis, a rotating pivot point joint is provided which is either a further overconstraint along the common axis through the balls which intercepts the channel utilized for the rotating pivot point joint or evidence that the fit of the pivot joints are not precise and are thereby incapable of accurately registering the two assemblies. Further, the support apparatus includes the ability to have the simulated socket members formed into slots in order to simulate jaw protrusions between dental models located on the upper assembly and lower assembly and such ability to simulate jaw protrusions is further evidence that the simulated socket members could be positioned in one of several locations resulting in the upper assembly having a range of positions relative to the lower assembly. Further, the rotating pivot point joint is required to insure that the desired registration between the upper assembly and lower assembly is maintained.

Other known prior art registration apparatus having deformable resilient members and the like are used to form a removable registration and holding means. In such known prior art apparatus, it is not possible to obtain a high degree of accuracy of registration which is unique and reproduceable due to the hysteresis, compliance and friction characteristics of the resilient members. Further, errors in dimensional accuracies occur due to inexact placement of the collars within a first member and the location of apertures having the resilient annular shaped members in a second member. An attempt is made to offset these errors by the ability of the deformable resilient members to yield and compensate for the variances in dimensional accuracies.

Another disadvantage of the known prior art devices is that most high precision devices are used at or near ambient room temperature. However, in a vacuum deposition process, the substrate, deposition masks, support apparatus and the like are subject to variable high temperature ranges which results in the parts experiencing thermal expansion, the magnitude of which is determined by the thermal coefficient of expansion of the appropriate materials and their changes in temperature.

In the known apparatus for registering a first member to a second member, such apparatus do not adequately compensate for thermal expansion and contraction of materials while attempting to maintain a high degree of registration between the first member and a second member. In addition, thermal expansions and contractions in such apparatus, which is not adequately compensated, can result in binding, seizing and jamming of the members.

Another disadvantage of the known prior art registration means and apparatus for registering a first member to a second member is that slight variations in geometrical dimensions between a plurality of second members each of which may have elongated means extending therefrom, such as for example, alignment pins, sockets, collars, dowels, or the like, likewise result in binding, seizing or jamming. If the dimension tolerances are relaxed to provide adequate clearances to overcome the same, precise accurate registration cannot be achieved.

The present invention overcomes several disadvantages of the prior art apparatus and method. In the preferred embodiment, the means for accurately registering a first member in operative relationship to the second member is adapted for use for aligning a substrate to a stabilized mask in a vacuum deposition process.

Thus, one advantage of the present invention is that a means for registering a first member to a second member can be utilized which will provide accurate registration of a first member to a second member in a high temperature environment and in an atmosphere which is less than atmosphere pressure such as the vacuum of a vacuum deposition process.

Another advantage of the present invention is that the apparatus for accurately registering a mask to a substrate can accurately establish and control the mask to substrate spacing.

Another advantage of the present invention is that the reference registration means can comprise a cone, vee groove and flat planar surface which is adapted to cooperate with alignment pins, having spherical shaped ends to permit reliable engagement and disengagement of a first member to a second member eliminating the possibility of binding, seizing and jamming therebetween to register the first member to the second member with zero clearance between the registration means.

A still yet further advantage of the present invention is that the means for registering a first member to a second member permits non-redundant indexing by providing a critically constrained system wherein accurate registration is obtained independent of expansion due to thermal coefficients of expansion and the like thereby avoiding binding, siezing and jamming of the registering means.

A still yet further advantage of the present invention is that the relative angle of the cone and vee groove can be selected to minimize the effect of friction developed by the co-action and sliding of the reference registration means and prealigned registration means relative to each other during the engagement and self alignment.

A yet still further advantage of the present invention is that the material selected for the cone, vee groove, flat planar surface and alignment pin can be selected for use in a high vacuum, high temperature environment to minimize friction at a high temperature and vacuum normally associated with a vacuum deposition process.

A still yet further advantage of the present invention is a method for accurate registration provides a sequence by which the cone, vee groove and flat planar surface are engaged with the alignment pins to minimize the effects of sliding friction due to the co-action therebetween.

A yet still further advantage of the present invention is that the reference registration means in terms of a cone, a vee groove and flat planar surface can be maintained in a relatively clean condition to prevent debris from building up on the surface thereof by the edge of the cone defining a shield member and by use shield members around the periphery of the vee groove and flat. The first member having the reference registration means and the shield member is positioned vertically relative to the second member with the openings of the cone, vee groove and shield members positioned downward such that gravity causes debris to fall out. When the second member is positioned relative to the first member, a small opening or labyrinth exists through which debris is restricted from migrating thereby reducing the buildup of dust or other contaminants on the surfaces of the reference registration members which would otherwise affect the alignment pins and the appropriate reference registration means surface.

A still yet further advantage of the present invention is that by the use of a prealigned registration means and reference registration means, alignment pins which form part of the prealigned registration means located on a second member can be rotatably mounted within the second member through eccentric means to permit adjustments of the pins in a first and/or second direction in a selected plane depending on the selected alignment pin to be matched to a selected reference registration means.

A still yet further advantage of the present invention is that the second member is initially indexed by an externally activated indexing mechanism into a position relative to the first member and the first member self-aligns and registers upon engagement with the second member and the self-aligning action results in the first member and second member co-acting interdependently with each other to inherently achieve a final, repeatable precise registration independent of the degree of accuracy in indexing the second member into position relative to the first member.

A still yet further advantage of the present invention is that one or more of the alignment pins together with its appropriate adjusting means can be adjusted to precisely position the associated alignment pin relative to a pattern located on a stabilized deposition mask such that a plurality of second members having adjustable alignment pins can be preregistered to a first member having the reference registration members such that accurate registration of a first member to any one of the second members will result in accurate registration therebetween.

A still yet further advantage of the present invention is that when a first member is accurately registered to a second member that the first member can be easily separated from the second member by a separation force which must only overcome gravity and when the first member is so separated another second member can be indexed into approximately the same position as the prior second member and the first member can then be accurately registered to the other second member having prealigned registration means located on the second member in substantially the same pattern as the original second member.

BRIEF DESCRIPTION OF THE DRAWING

The foregoing and other advantages and features of this invention will become apparent from the following description of the preferred embodiment when considered together with the illustrations and accompanying drawings which include the following figures:

FIG. 1 is a front plan view, partially in cross section, showing the use of the accurate registration means for aligning a gantry means having a substrate relative to a stabilized mask assembly having prealigned registration members located thereon;

FIG. 2 is an orthographic projection of a mask supporting apparatus which is partially pictorial showing a stabilized mask assembly as a second member having a plurality of prealigned registration members mounted thereon and a diagrammatic representation of reference registration members which are adapted to be positioned on the first member;

FIG. 3 is a top plan view of a mask supporting apparatus having prealigned registration members including adjusting means and alignment pins located on the periphery thereof;

FIG. 4 is a sectional view taken along section lines 4—4 of FIG. 3;

FIG. 5 is a right-end plan view of a mask supporting apparatus of FIG. 3;

FIG. 6 is an partial view partially in cross section showing the relationship between an eccentric bushing and an elongated member which includes an alignment pin being supported thereby;

FIG. 17 is a sectional view taken along section lines 17—17 of FIG. 15;

FIGS. 18, 19 and 20 are partial views partially in cross section showing the constructions of a flat planar surface, a vee groove and a cone, inclusively;

FIG. 21 is a pictorial representation of a prealigned registration means which are operatively mounted onto a second member which are disengaged from reference registration means which are operatively mounted onto a first member;

FIGS. 22, 23, and 24 illustrate pictorally the sequence in which a cone, vee groove and flat planar surface can be loaded against and co-act interdependently with the associated alignment pins;

FIG. 25 is a diagrammatical representation of the degrees of adjustment and relative motion between eccentric bushing and an elongated member including its alignment pin and movement thereof relative to a second member;

FIGS. 26(a) through 26(e) inclusive, are pictorial representations of the various adjustments which can be made between the eccentric bushing and alignment pin to obtain the desired location of the axis of an alignment pin through a selected plane, FIG. 26(f) shows adjustment of the alignment pin without the use of an eccentric bushing and FIG. 26(g) shows the alignment action of a second member due to the adjustment shown in FIG. 26(f).

FIG. 27 is a bottom plan view of a different embodiment of an eccentric bushing having an aperture extending axially therethrough with the axis thereof located on a line which is offset from the center line of the eccentric bushing at a 45° angle relative to the X-Y adjustment directions and an elongated member having a collar, shank and an eccentric alignment pin mounted thereon.

DESCRIPTION OF THE PREFERRED EMBODIMENT

Figure 8:
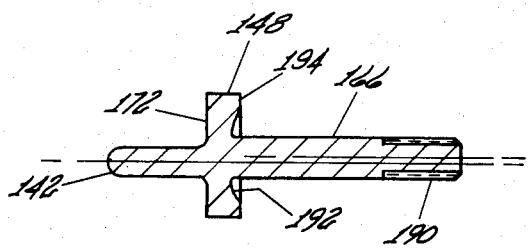
FIG. 8 is a sectional view of an elongated member taken along section lines 8—8 of FIG. 7 showing an alignment pin and collar at one end thereof and a shank at the other end thereof.

FIG. 1 illustrates the use of the means for accurately registering a first member in an interdependent relationship to a second member for use in vacuum deposition process. Specifically, a mask supporting apparatus shown generally by arrow 30, includes a dimensionally stabilized mask supporting frame 32 which includes a relatively thin, substantially planar mask 40. The mask supporting apparatus 30 includes prealigned registration means, shown generally by arrow 42, which includes an adjusting means 44, which is adapted to support an elongated member 46, having one end thereof which terminates in an alignment pin 48 and a shank 50.

The mask supporting apparatus 30 is positioned within a carriage assembly 60 by means of a mask support housing 62.

A shielding means 66 extends through an aperture 68 formed in the carriage assembly 60 which provides a passageway 70 which permits vapor material shown by arrow 72 eminating from a source of vapor material 74 to pass therethrough. The vapor material 72 passing through passageway 70 passes through the apertures 120 in the substantially planar mask 40 and onto a substrate 80 which is supported by gantry means shown generally by arrow 82. The gantry means 82 is part of a gantry assembly shown by arrow 84. Means, shown by arm 86 is provided to move the gantry assembly 84 including gantry means 82 and substrate 80 relative to the substantially planar mask 40 which, in the preferred embodiment, is a vacuum deposition mask.

The gantry means 82 includes reference registration means shown generally as 90 which are mounted thereon and which are adapted to co-act with the prealigned registration means 42.

In operation, the carriage assembly 60 supports the mask 40 relative to a working station located above and in a working relationship with the source 74. When the gantry means 82 and the mask supporting apparatus 30 are loaded against each other, the reference registration means 90 co-acts interdependently with the pre-aligned registration means 42 to obtain accurate registration therebetween.

The term "interdependently" when used herein means that the first member and second member are adapted to be loaded against each other and, when engaged, the reference registration means and prealigned registration means are mutually dependent on each other to co-act such that the first and second members actually move relative to each other as necessary in a predetermined manner and sequence and ultimately accurately register in a selected, predictable and repeatable position relative to each other.

FIG. 2 illustrates a mask supporting apparatus which includes a stabilized mask assembly 100 which comprises a dimensionally stabilized mask supporting frame 32 and the relatively thin, substantially planar mask 40. The dimensionally stabilized mask supporting frame 32 has an opening 106 (which is shown in FIG. 4) extending through the center thereof. Means including a circumferentially extending surface, which in the preferred embodiment is a raised ridge 110. The raised ridge 110 extends around the periphery of the opening 106 and on one side of the dimensionally stabilized mask supporting frame 32. The dimensionally stabilized mask supporting frame 32 includes means for defining a frame flange 112 which supports the circumferentially extending surface or raised ridge 110.

The relatively thin, substantially planar mask 40 is formed of a material having a predetermined yield strength and a selected geometrical shape and dimension. The mask 40 is positioned adjacent the opening 106 and contiguous the circumferentially extending surface or raised ridge 110. The mask 40 has a plurality of apertures 120 extending therethrough and arranged in a predetermined array defining a thin film pattern illustrated by grouping 122.

A means for rigidly affixing the periphery of the mask 40 to the circumferentially extending surface or raised ridge 110 applies a radial tension to the mask 40. In the preferred embodiment, the means for rigidly affixing the periphery of the mask 40 to the raised ridge 110 is a weld. The radial tension applied to the mask has a magnitude which establishes a stress on the mask 40 during use thereof which is less than the predetermined yield strength of the mask when the mask is used over a temperature range of a deposition process including specifically, the operating temperatures of a deposition environment. Also, the radial tension is adapted to maintain a stress of sufficient magnitude to keep the mask 40 under tension independent of variations in radial tension due to the thermal expansion characteristics of the mask 40 to dimensionally stabilize the thin film pattern 122 at the operating temperature of a deposition environment.

In the preferred embodiment as illustrated in FIG. 2, three prealigned registration means 130, 132 and 134 are shown. In the preferred embodiment, the three prealigned registration means are mounted on the frame flange 112 through support apertures 176 (shown in FIG. 6) formed into the dimensionally stabilized mask supporting frame 32. In the description set forth herein, the term prealigned registration means and reference registration means include elements which function to align the first and second members as described herein. Structurally, the "means" are "members" having specific sizes, shapes and dimensions to accomplish the functions. Accordingly, the terms "prealigned registration means" and "prealigned registration members" are used interchangeably and, likewise, the terms "reference registration means" and "reference registration members" are used interchangeably.

In the preferred embodiment, each of the prealigned registration members 130, 132 and 134 includes an eccentric bushing and an elongated member which has an alignment pin, collar and shank. This is shown in greater detail in FIGS. 3 to 6.

In FIG. 2, the prealigned registration members 130, 132 and 134 include alignment pins 142, 144 and 146 which are a part of elongated members 148, 149 and 150, respectively.

Reference registration means, shown generally by arrows 90, are adapted to be operatively coupled to a first member, such as for example the gantry means 82 of FIG. 1, which is to be accurately registered in an interdependent relationship with a second member such as for example, the stabilizing mask assembly 100 of FIG. 2. The reference registration means, shown by arrows 90, include three elongated means receiving means which are adapted to be positioned on and fixedly attached to the first member in substantially the same predetermined pattern as the prealigned registration means 130, 132 and 134 are mounted on the second member. In the preferred embodiment, the three elongated means receiving means are a cone 152, a vee groove 154, and a flat planar surface 156.

FIGS. 3, 4, 5 and 6, show in detail the mounting of the prealigned registration members 130, 132 and 134 within the flange 112 of the dimensionally stabilized mask supporting frame 32. Each of the members 130, 132 and 134 include an elongated member 148, 149 and 150, having an alignment pin 142, 144 and 146, respectively, extending therefrom. As illustrated in FIG. 5, the elongated members 148, 149 and 150 include a shank 166, 168 and 170, respectively. The elongated members 148, 149 and 150 are supported within eccentric bushings shown as 160, 162 and 164, respectively.

Figure 7:
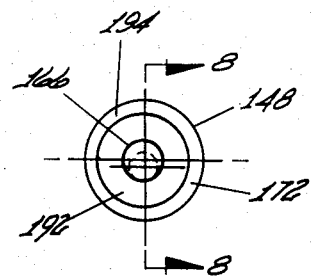
FIG. 7 is a bottom plan view of the elongated member.
Figure 9:
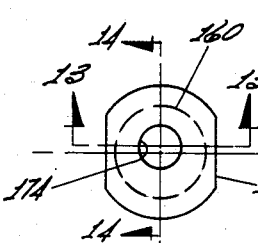
FIG. 9 is a bottom plan view of the eccentric bushing.

FIGS. 7 and 8 show in detail the construction of an elongated member 148 which is typical. The elongated member 148 includes a collar 172 having a shank 166 extending from one side thereof. The shank 166 has a selected diameter to enable the same to be rotatably positioned in the aperture 174 of eccentric bushing 160 shown in FIG. 6. The end or tip of the shank 166 terminates in a threaded end 190 which is adaptable to receive a nut, such as nut 184 shown in FIG. 6. The surface of the collar 172 positioned adjacent the shank 166 is beveled or ground as shown by groove 192, to form a discrete clamping surface 194. In the embodiment illustrated in FIGS. 7 and 8, the axis of the shank 166 is coaxially aligned with the axis of collar 172.

Extending from the other side of collar 172 is an alignment pin 142 which terminates in a spherical end. The diameter of the alignment pin 142 is shown to be less than that of the shank 166. The axis of the alignment pin 142 is offset relative to the coaxially aligned axes of the collar 172 and shank 166.

Figures 12, 13:
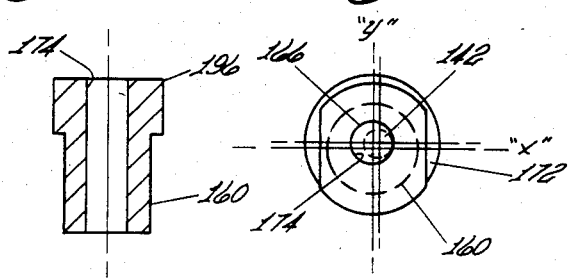
FIG. 13 is a sectional view of the bushing of FIG. 9 taken along section lines 13—13 of FIG. 9.
Figure 14:
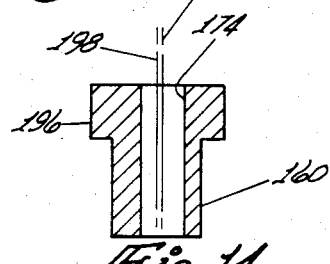
FIG. 14 is a sectional view of eccentric bushing taken along section lines 14—14 of FIG. 9.

Referring to FIGS. 9 through 14, inclusive, an eccentric bushing 160 has an aperture 174 extending therethrough. The aperture 174 is off center relative to the axis of the eccentric bushing 160 and is parallel thereto as shown in FIG. 14. The shank 166 of elongated member 148 is rotatably positioned in the aperture 174 of the eccentric bushing 160. The axial length of the shank 166, in the preferred embodiment, has sufficient length to extend through the eccentric bushing 160, such that a spring washer 182, shown in FIG. 6, can be positioned thereon and the threaded end 190 of the shank 166 is adapted to receive a nut 184. A shim 180 can be positioned under the collar 172 such that it is located between the collar 172 and the frame flange 112 to provide a tight clamping action therebetween. By use of a clamping surface 194, shown in FIGS. 7 and 8, which is formed around the periphery of the collar 172 on the side thereof towards the shank 166, a large frictional component of force is established which holds the elongated member 148 in position after it is adjusted to a predetermined position as described hereinafter.

Figure 10:
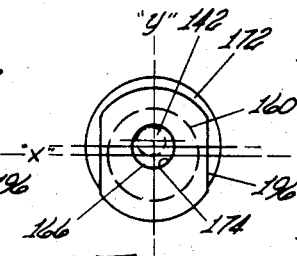
FIGS. 10 through 12, inclusive, are bottom plan views of an eccentric bushing having an aperture extending axially therethrough with the axis thereof offset from the center line of the eccentric bushing and the shank of the elongated member located in the aperture and showing various rotational positions therebetween and the position of an alignment pin at such positions.
Figure 11:
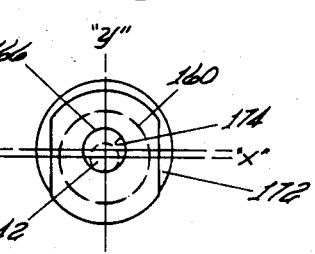

In FIGS. 10 through 12, inclusive, the aperture 174 has the axis thereof offset above the center line of the axis of the eccentric bushing 160.

FIGS. 13 and 14 show the eccentric bushing 160 which terminates in a boss 196 having two flat surfaces thereon which is adapted to receive an adjusting tool.

FIGS. 10, 11 and 12 illustrate an elongated member 148 mounted into the bushing 160 such that the shank 166 of the elongated member 148 is rotatably mounted in the aperture 174 of bushing 160. The collar 172 is spaced from the bushing 160 by the combination of the frame flange 112 and shim 180 as shown in FIG. 6. As illustrated in FIG. 6, the thickness of the shim 180 can be selected of a thickness to adjust the spacing between the first member and second member. In addition, FIG. 6 illustrates an important relationship between the elongated member 148 and the bushing 160. The end of the elongated member 148 having the alignment pin 142 is held in position by a clamping force or friction force developed between the collar 172 being urged against the shim 180 which, in turn, is urged against the frame flange 112. The other end of the elongated member 148 having the shank 166 creates the clamping force by the nut 184 and spring washer 182, which spring washer is in turn urged against the opposite surface of the frame flange 112 through boss 196. One effect of this clamping force is to prevent the elongated member 148 from rotating when the bushing 160 is rotated while concurrently permitting lateral movement of the elongated member in an "X", "Y", or "X" and "Y" direction for adjustment purposes. The description of FIGS. 10, 11, 12, 25 and 26 hereinafter are based on this understanding.

In FIG. 10, the center line of alignment pin 142 is positioned to be offset above the center line of the aperture 174. In the relationship between the bushing 160, the shank 166 and alignment pin 142, as shown in FIG. 10, a small rotation of the bushing 160 or the shank 166, or both, produces a displacement of the alignment pin 142 in predominantly the "X" direction, although a very small or minimal displacement will inherently occur in the "Y" direction.

FIG. 11 illustrates that the center line of the alignment pin 142 is positioned coaxially on the center line of the bushing 160 and off of the center line of aperture 174. In the relationship shown in FIG. 11, a small rotation of the bushing 160 or the shank 166 or a small rotation of both in opposite directions produces a displacement of the alignment pin 142 in predominantly the "X" direction, although a very small or minimal displacement will inherently occur in the "Y" direction.

FIG. 12 illustrates that the center line of the aperture 174 is offset above the center line of the bushing 160 and the alignment pin 142 is offset to the right of the common center line of the aperture 174 and shank 166. A small rotation of only the bushing 160 displaces the alignment pin 142 in predominantly an "X" direction. A small rotation of only the shank 166 only displaces the alignment pin 142 in a predominantly "Y" direction.

Thus, selective adjustment of the bushing 160 and/or shank 166 can provide a selected displacement of the alignment pin 142 along the "X", "Y" or "X" and "Y" axes.

FIGS. 13 and 14 illustrate the details of construction of the eccentric bushing 160 to show the offset between the axis 198 of the bushing 160 and the center line 200 of the aperture 174.

The eccentric bushings illustrated in FIGS. 9 through 12, inclusive, are deemed to be an adjusting means which rotatably movably supports one of a selected number of elongated members for adjustment in one or two directions in a selected plane. As illustrated in FIG. 12, the alignment pin 142 can be adjusted independently of the position of the eccentric bushing 160. Separate movements of the eccentric bushing 160 and of the shank 166 provide the ability to move the alignment pin 142 in both an "X" and "Y" direction. FIGS. 10 and 11 illustrate the ability to adjust the alignment pin 142 in a predominately "X" direction only.

Figure 15:
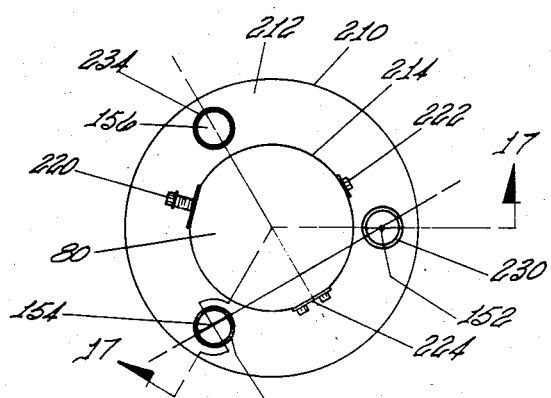
FIG. 15 is a bottom plan view of a gantry means including a substrate.
Figure 16:
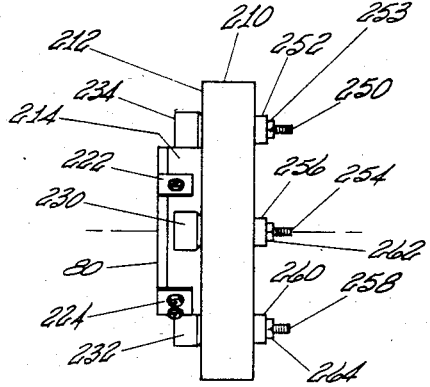
FIG. 16 is a right-end plan view of the gantry means of FIG. 15.

FIGS. 15 and 16 illustrate a gantry means which is adapted to support a substrate 80. The gantry means is illustrated generally as arrow 82 in FIG. 1. In the preferred embodiment, the gantry means includes a substrate holding means 210 for supporting a substrate 80 in a predetermined relationship to the source. The use of the gantry means in an assembled apparatus is illustrated in FIG. 1 and the position of the substrate 80 of FIG. 1 relative to the source of vapor material 74 is illustrated therein.

The gantry means includes reference registration members 230, 232 and 234. The reference registration members 230, 232 and 234 are located in substantially the same predetermined relationship on the flange 212 of the substrate holding means 210 and are adapted to co-act with the prealigned registration members located on the dimensionally stabilized mask supporting frame 32 illustrated in FIG. 2. In use, the reference registration members 230, 232 and 234 are adapted to co-act with the prealigned registration members 130, 132 and 134 illustrated in FIG. 2, for accurately registering a substrate 80 in a precise position relative to the mask supported by the dimensionally stabilized mask supporting frame 32. The reference registration members 230, 232 and 234 include elongated means receiving means such as for example the cone 152, the planar surface 156 and the vee groove 154 for receiving the alignment pins 142, 144, and 146 of the prealigned registration members 130, 132, and 134, respectively.

In the preferred embodiment, a predetermined relationship exists between the reference registration members 230, 232 and 234 and the prealigned registration members 130, 132 and 134. Specifically, the cone 152 is adapted to cooperate with elongated member 148, vee groove 154 is adapted to cooperate with elongated member 150 and the planar surface 156 is adapted to cooperate with the elongated member 149.

In FIGS. 15 and 16, the substrate 80 is held fixed in position over a raised central hub 214 by edge clamping members 220, 222 and 224.

The reference registration members and the prealigned registration members cooperate with each other in order to accurately register the subtrate 80 to the mask 40 which is rigidly fixed to the dimensionally stabilized mask supporting frame 32 illustrated in FIG. 2.

FIG. 16 shows in detail the method for mounting the reference registration members 230, 232, and 234 on the substrate holding means 210. Specifically, the reference registration member 230 is secured by means of a threaded end 254 through a washer 256 and a nut 262. Likewise, reference registration member 232 is affixed to the substrate holding means 210 through a threaded end 258, washer 260 and nut 264. Reference registration member 234 is rigidly affixed to the substrate holding means 210 through threaded end 250, washer 252 and nut 253.

FIG. 17 shows in detail the construction of the substrate holding means 210 (in an inverted position) having the portion thereof supporting the substrate 80 directly over the raised central hub 214.

In FIG. 17, the cone 152 is held rigidly against the substrate holding means 210 by means of a fastening member which terminates in a threaded end 254 which is held in position by a washer 256 and a nut 262.

Likewise, the vee groove 154 is held in position by a fastener which terminates in a threaded end 258 which is held in position by a washer 260 and a nut 264.

FIGS. 18, 19 and 20 show in greater detail the relationship between the prealigned registration means and the reference registration means when the same are loaded against each other enabling the elongated means to co-act interdependently with the elongated means receiving means to restrain lineal and rotational movements between the first member and a second member without redundancy of constraint in any of the six degrees of freedom to accurately register a first member relative to a second member.

Specifically, the alignment pins 142, 146, and 144 are adapted to engage and be received by the cone 152, vee groove 154 and planar surface 156, respectively. Vee groove 154 and the planar surface 156 have shields 270 and 272 positioned therearound, respectively. The cone 152 defines a conical shaped surface which is adapted to receive and seat the alignment pin 142. Likewise, vee groove 154 defines a groove-shaped inner surface which is adapted to receive and cooperate with the alignment pin 146. The planar surface 156 defines a flat surface segment which is adapted to cooperate with the alignment pin 144. Each of the reference registration means is mounted within the substrate holding means 210 as described in FIGS. 15, 16 and 17. Specifically, the cone 152 is affixed by threaded end 254 in position as illustrated in FIG. 17. Likewise, vee groove 154 is fastened to the substrate holding means 210 by threaded end 258 and planar surface 156 is affixed to the substrate holding means 210 by means of a threaded end 250.

FIGS. 21, 22, 23 and 24 define the apparatus and method for accurately registering a first member in an interdependent operative relationship to second member.

FIG. 21 illustrates generally that the prealigned registration means 130, 132 and 134 are adapted to be operatively coupled to second member. The prealigned registration means includes three elongated members having alignment pins, such as for example, alignment pin 142 mounted on prealigned registration means 130, alignment pin 144 mounted on prealigned registration means 132, and alignment pin 146 mounted on prealigned registration means 134. The prealigned registration means 130, 132 and 134 including the elongated members which include alignment pins 142, 144 and 146, respectively, are adapted to be positioned in a spaced relationship to each other and in a predetermined pattern on and extending generally in the same direction from the second member. One of the three elongated members which includes alignment pin 142 on prealigned registration means 130, is adapted to be selectively mounted on a second member and have a portion thereof defining a primary registration point. In the preferred embodiment, the alignment pins have a portion thereof which is spherical in shape and which is adapted to engage its corresponding reference registration means as will be explained in further detail hereinafter. In this embodiment, the primary registration point is located at the center of the sphere defining the spherical end of alignment pin 146.

A second one of the three elongated means including alignment pin 146 mounted on the prealigned registration means 134 wherein the end of the alignment pin 146 defines a secondary registration point which is other than the primary registration point defined by the end of the alignment pin 142. The primary registration point defined by the end of alignment pin 142 and the secondary registration point defined by the end of pin 146 define a line of rotation 284. In this embodiment, the secondary registration point is located at the center of the sphere defining the spherical end.

A third of the three elongated members including alignment pin 144 mounted on prealigned registration means 132 is adapted to be selectively mounted on the second member and have a portion thereof defining a tertiary registration point at the end of the alignment pin 144 which is located at a point other than on the line of rotation 284 defined by the primary registration point and the secondary registration point defined by ends of alignment pins 142 and 146. In this embodiment, the tertiary registration point is located at the point of contact between the end of the alignment pin 144 and flat planar surface 156.

Reference registration means 230, 232, and 234 are adapted to be operatively coupled to the first member which is to be accurately registered in an interdependent relationship to the second member. The reference registration means include three elongated means which, in the preferred embodiment, are a cone 152, vee groove 154 and planar surface 156. The reference registration means 230, 232 and 234 are adapted to be positioned and fixedly attached to a first member in substantially the same predetermined pattern as the prealigned registration means 130, 132 and 134 are mounted on the second member.

The sequence in which the prealigned registration means engage the reference registration means is significant in order to minimize the effects of friction which might otherwise prevent or inhibit co-acting thereof.

When the second member is a deposition mask and the first member is a gantry means holding a substrate, which is the preferred embodiment, the engaging and disengaging occurs in a vacuum and often at elevated temperatures in a vacuum deposition process. In a vacuum environment and especially at elevated temperatures the coefficient of friction between the prealigned registration means and the reference registration means can be extremely high as is generally known to a person skilled in the art.

Thus, when a first member and second member are moved relative to each other to permit the prealigned registration means to engage the reference registration means, the use of a proper sequence for engagement therebetween helps insure accurate registration between the first member and second member.

FIGS. 22, 23 and 24 will now be utilized to describe that sequence.

First, the first member to be accurately registered to a second member and the second member are moved toward each other. The second member includes a prealigned registration means 130, 132 and 134 located in a predetermined pattern thereon. The prealigned registration means 130, 132 and 134 include a selected number of elongated members which include alignment pins 142, 144 and 146 extending outwardly from a selected surface of the second member with the axis of each of the elongated member 142, 144, and 146 being substantially perpendicular to a selected plane and wherein one of the elongated members, such as for example, alignment pin 142, is adjustable in two directions within the selected plane. A second one of the elongated members, such as elongated pin 146, is adjustable in at least one direction other than along a line of rotation 284 extending through the axis of the first alignment pin 142 and in the selected plane. A third one of the elongated members, such as alignment pin 144 is located at a located other than on the line of rotation 284 in the selected plane.

The first member includes reference registration means 230, 232 and 234 fixedly positioned thereon in substantially the same predetermined pattern as the alignment pins 142, 144 and 146 in position on the second member. The reference registration means includes elongated means receiving means equal in number to the selected number of elongated members. In the preferred embodiment, there were three elongated members 148, 149 and 150. Accordingly, there are three registration means 230, 232 and 234.

When the first and second members are moved toward each other, the loading of a predetermined one 148 of the selected number of elongated members, which includes alignment pin 142 against a predetermined one of the elongated means receiving means element of the reference registration member, such as cone 152, superimposing the primary registration point onto a primary reference point which is defined by cone 152. This is illustrated in FIG. 22. At the time of engagement, the other alignment pins 146 and 144 are not in engagement with their corresponding vee groove 154 and flat planar surface 156, respectively. When the cone 152 is in engagement with the spherical end of alignment pin 142, a rotatable support is established which fixes lineal movement in all three mutually orthogonal axes between the primary registration point and the primary reference point and which permits rotational movement in all three rotational degrees of freedom about the primary reference point. This is illustrated by arrows shown in FIG. 22 which depict the degrees of freedom which are restricted.

FIG. 23 shows the next step of loading a second predetermined one of the selected number of elongated members, such as alignment pin 146 against a second predetermined one of the elongated members receiving members such as the vee groove 154 wherein the spherical end of alignment pin 146 co-acts with groove 154 to superimpose the secondary registration point onto a reference line segment which is defined by the vee groove establishing a secondary reference point at the point of superimposition. The secondary alignment pin 146 is positioned relative to the first alignment pin 142 to define a line of rotation 284 between the primary registration point and the secondary registration point in a selected plane. The line of rotation 284 is shown in FIG. 23 as passing through the center of the ends of alignment pins 142 and 146. All lineal movements of the first member relative to the second member are now fixed. In addition, two of the three rotational degrees of freedom are also restricted leaving rotation about the line of rotation 284 as the only permitted degree of freedom remaining for movement between the first member and second member.

The co-acting relationship between the vee groove 154 and the spherical shaped end of alignment pin 146 as described above was based upon the prior co-acting relationship between the cone 152 and the spherical shaped end of alignment pin 142 restricting all lineal movements and two of the three rotational degrees of freedom between the first member and the second member.

However, absent the above prior co-acting relationship between the cone 152 and alignment pin 142, the vee groove 154 and alignment pin 146 co-act to independently restrict lineal movements of the first member and the second member at the secondary reference point in a plane perpendicular to the reference line segment defined by vee groove 154 and which permits lineal movements of the secondary reference point along the reference line segment and which permits rotational movements in all three rotational degrees of freedom. The restricted direction of linear movements imposed by the vee groove 154 and alignment pin 146 independently co-acting are illustrated by arrows adjacent the vee groove 154.

The results of the combined restrictive effect of the superimposing of the primary registration point with the primary reference point and the secondary registration point with the secondary reference line segment is to fix all lineal movement and two of the three degrees of rotational movement and permit only one degree of rotation between the first member and second member, that being rotation about the line of rotation 284.

As shown in FIG. 24, the next step of the registration sequence is rotating the first member and second member relative to each other around the line of rotation 284 to position a third predetermined one of the selected number of elongated members 144 to co-act with the third predetermined one of the selected number of reference registration members which, in the preferred embodiment, is the planar surface 156 having the reference plane segment to superimpose the tertiary registration point onto the reference plane segment. FIG. 24 shows the angle of rotation 286. As described above, the only remaining degree of freedom between the first member and second member is rotation about the line of rotation 284. Rotation of the first member and second member around the line of rotation 284 and towards each other occurs until the end of alignment pin 144 engages the flat planar surface 156 superimposing the tertiary registration point onto the reference plane segment defined by the flat planar surface 156 to establish a tertiary reference point which fixes the last rotational degree of freedom. When this occurs, all six degrees of freedom are then fixed without any one being overconstrained.

If the superimposing of the tertiary registration point and tertiary reference point occurred independently, the effect would to be restrict lineal movement of the first member and second member along an axis perpendicular to the reference plane segment at the point of contact with the reference plane segment while permitting lineal movements along the reference plane segment and rotational movements in all three rotational degrees of freedom about the tertiary reference point. The restriction of linear movement imposed by the superimposing of the tertiary registration point with the independent reference plane segment 156 is depicted by the arrow adjacent the alignment pin 144.

As illustrated in FIGS. 22, 23 and 24, the prealigned registration means are preadjusted such that repeatable and predetermined accurate registration and resulting alignment of the first member and second member to each other will occur at all times and that the first member can be repeatably and predeterminedly accurately registered with any one of a plurality of prealigned different second members.

The method for adjusting the pins to insure this occurs is illustrated in detail with respect to FIGS. 25 and 26.

In FIG. 25, the center line of the eccentric bushing is represented by center line 300. The center line of the shank of the elongated member is represented by center line 302 and the center line of the alignment pin in a first position is represented by center line 304. The mechanical construction and interelationship between the bushing, shank and alignment pin is depicted in connection with FIGS. 6 through 14, inclusive.

The displacement of the alignment pin in a "Y" direction only can be obtained by rotating the shank such that the attached alignment pin center line is moved into a different position such as that shown by the center line 306.

A method of obtaining "X" displacement of the alignment pin is by rotating the bushing such that the center line of the shank is moved from position 302 to position 308 which shifts the center line of the alignment pin from 304 to 312. If desired, a "Y" displacement of the alignment pin after the alignment pin has been moved through, an "X" displacement can be obtained by rotating the shank about center line 308 moving the center line of the alignment pin from its location at 312 to the center line position shown as 314. Thus, the "X" and "Y" displacement of the alignment pin is illustrated in FIG. 25.

In the preferred embodiment, the ability to adjust the alignment pin in an "X" and "Y" direction is utilized in adjusting the alignment pin 142 which is adapted to engage the cone 152.

FIGS. 26(a) through 26(c) illustrate three methods for adjusting the alignment pin 142 to obtain either "X", "Y" or "X" and "Y" displacement. FIG. 26(a) illustrates that the center line of the eccentric bushing 300, the center line of the shank 302 and the center line of the alignment pin 304 in a starting position. Rotation of the bushing about its center line 300 holding the shank 302 in fixed rotational orientation, results in the center line of the shank moving from position 302 to position 308 which shifts the center line of the pin from position 304 to 312 giving the desired "X" displacement.

FIG. 26(b) illustrates diagramatically a method for adjusting alignment pin 142 in order to obtain both "X" and "Y" adjustment. The bushing is rotated about center line 300 which displaces the center line of the shank to position 308. The rotation of the bushing about its center line 300 moving the shank to the position illustrated by center line 308 shifts the center line of alignment pin 304 to the position illustrated by 312. Then, the shank can be rotated about center line 308 which moves the center line of the alignment pin from position 312 to position 314. Such rotations provide both an "X" and "Y" displacement of the alignment pin.

FIG. 26(c) shows a method for obtaining "Y" displacement only of the alignment pin. The "Y" displacement only is obtained by rotating the alignment pin about shank 302 to displace the center line of the alignment pin from position 304 to position 306.

FIGS. 26(d) and 26(e) illustrate a method for adjusting the alignment pin in a single direction only, such as would be used for alignment pin 146 which is adapted to engage vee groove 154. In the preferred embodiment, the alignment pin 146 of the prealigned registration means 134 would be adjusted in a single direction preferably perpendicular to the reference line segment defined by the vee groove 154 in order to provide alignment at the vee groove 154. The center line of the eccentric bushing 300 is essentially fixed in position and the initial center line of the shank is shown by center line 302. In its beginning position, the center line of the alignment pin is shown as 304. In FIG. 26(d), the center lines of the eccentric bushing 300, the shank 302 and alignment pin 304 are in alignment.

In FIG. 26(d), a deflection in a "Y" direction can be obtained by rotating the shank about its center line 302 moving the position of the center line of the alignment pin from position 304 to 306. If an additional displacement of the alignment pin is required in the "Y" direction, the additional displacement is obtained by rotating the bushing about center line 300 maintaining the shank in position which would transpose the center line of the shank from 302 to 308. The rotation of the bushing 300 would likewise move the center line of the alignment from position 306 to position 312.

FIG. 26(e) illustrates an alternate method whereby the "Y" displacement can be precisely controlled, or, if desired, that the center line of the alingment pin can be matched to the center line of the eccentric bushing. The center line of the bushing 300 and the center line of the shank 302 are shown such that the shank is rotated within the eccentric bushing to position the center line of the alignment pin coaxially with the center line of the eccentric bushing as illustrated by center line 304. Rotation of the eccentric bushing about its axis 300 would rotate the center line of the shank from its position 302 to position 316, and move the alignment pin center line to position 320. Alternatively, the shank only can be rotated at its center line 302 displacing the center line of the alignment pin from position 304 to position 306. Alternatively, the bushing can be rotated about its center line 300 transposing the center line of the shank to the position illustrated by 316. Thereafter, the shank can be rotated placing the center line of the alignment pin in position 318 to obtain the desired "Y" displacement.

FIGS. 26(f) and 26(g) show an alternative method whereby "Y" displacement of the alignment pin, which is offset relative to the center line 302 of the shank, can be obtained by rotation of the shank which is rotatably mounted within an aperture thereby eliminating the eccentric bushing. The alignment pin can be rotated to any desired "Y" position as illustrated by the center lines of the alignment pins located at positions 304, 306 and 322.

FIG. 26(g) illustrates the rotation of the shank about its center line 302 to move the alignment pin from its position 304 to position 306 which is a displacement in the "Y" direction. The movement of the alignment pin 146 which is shown in FIGS. 21 to 24, results in a rotational shift "$\theta$" of the line of rotation 284 about the primary registration point located in the end of alignment pin 142. The displacement of the alignment pin 146 results in the spherical end of the alignment pin 146 being physically moved relative to the deposition mask and thereby physically shifts the line of rotation 284 relative to the deposition mask and flange supporting the same.

FIG. 26(g) is based upon the assumption that the first elongated member, which in the preferred embodiment would incorporate alignment pin 142, is adjusted to its appropriate "X" and "Y" position using the techniques of FIGS. 26(a), 26(b) or 26(c). After it is set in position, the second alignment member, which in the preferred embodiment, would be alignment pin 146, needs to be adjusted only in the "Y" direction to accomodate the vee groove 154 to produce a rotation about the cone 152 and alignment pin 142 of the second member relative to the first member.

In FIGS. 25 and 26, the descriptions thereof were based upon the criteria that rotation of the eccentric bushing did not produce a corresponding rotation of the elongated member. In certain configurations other than those described in FIGS. 6 and 7, rotation of the eccentric bushing might produce a corresponding rotation of the elongated member if the elongated member is not clamped or held so as to prevent rotational movement thereof with rotation of the eccentric bushing. In the case where rotation of the eccentric bushing would rotate the eccentric bushing and the elongated member as an integral assembly, the offset of the elongated member and the bushing as shown in FIGS. 12, 25 and 26, would not produce the relatively independent "X" and "Y" adjustment from the separate adjustment of each member as shown in FIGS. 25 and 26.

FIG. 27 shows another embodiment of an eccentric bushing and an elongated member wherein the offset of the aperture of the eccentric bushing is positioned relative to the bushing center line such that it is adapted to receive the shank of the elongated member and to position the center line of the shank 45° off of the center line of the eccentric bushing relative to the "X" and "Y" adjustment directions. In FIG. 27, the offset of the alignment pin in the elongated member is illustrated to be in a "Y" direction and below the center line of the shank.

In the embodiment of FIG. 27, the combination of the eccentric bushing 334 having the elongated member 338 rotatably mounted therein is fabricated such that rotation of the eccentric bushing 334 will rotate the elongated member 338 including its collar 330. With the construction illustrated in FIG. 27, rotation of the shank 336 only produces a movement of the alignment pin 340 in the "X" direction. Similarly, a rotation of the eccentric bushing 334 and the elongated member 338, as an integral assembly, produces a movement of the alignment pin 340 in the "Y" direction thereby producing relative independent "X" and "Y" adjustments from the two separate rotational movements as described herein.

If desired, additional plots of the degrees of adjustment available using the embodiment of FIG. 27 would likewise produce the adjustment variation which are described above in connection with FIGS. 26(a) to 26(g), inclusive.

As noted hereinabove, in the preferred embodiment, the second member is a dimensionally stabilized deposition mask having the prealigned registration members positioned thereon which are adapted to receive and cooperate with reference registration members which are attached to a gantry means which includes a substrate holding means for positioning a substrate in accurate alignment with the deposition mask. Since the preferred embodiment utilizes the teachings of this invention in a vapor deposition application where frictions are abnormally high, calculations were conducted to determine the optimum vee groove angles for a range of selected cone angles and the maximum allowable friction coefficient based upon the specific resulting combination of angles for the cone and vee groove wherein the alignment pins are in contact with their associated cones, vee grooves and planar surfaces but one of more of the same are out of the final engagement position which would occur when the desired registration is obtained. Set forth hereinbelow is a chart which shows the selected half angle of the cone, the resulting optimum half angle of a vee groove to cooperate with that cone and a maximum allowable friction coefficient associated with those angles to insure that registration will occur.

| Cone (Half Angle) | Optimum Vee Groove Angle (Half Angle) | Maximum Allowable Friction Coefficient |
|---|---|---|
| 20° | 42.5° | 0.44 |
| 25° | 47.4° | 0.39 |
| 30° | 51.4° | 0.35 |
| 35° | 54.5° | 0.32 |
| 40° | 58.7° | 0.28 |
| 45° | 62.0° | 0.25 |

As noted above, a half angle of the cone was varied from 20° to 45° which equals a total included cone angle of 40° to 90°. The half cone angle selected for practicing the invention was 30°.

Likewise, the resulting optimum angle of the vee groove ranged from a half angle of 42.5° to a half angle of 62.0° with the resultant vee groove half angle being 51.4° based upon the selected half angle of the cone being 30°. The maximum allowable friction coefficients resulting from the range of calculated angles covers the range of 0.44 wherein the cone half angle is approximately 20° and the vee groove half angle is approximately 42.5° to a maximum allowable friction coefficient of 0.25 wherein the cone half angle is 45° and a optimum vee groove half angle is 62.0°.

In the preferred embodiment, the cone half angle was selected to be a 30° or a total included angle for the cone of 60° and the optimum vee groove half angle was selected to be 51.4° or a total included angle of the vee groove of 102.8°.

In one embodiment of the invention, apparatus used in a vacuum deposition process utilized a cone having a half angle of 30° and a vee groove having a half angle of 45°. Although the optimum half angle of the vee groove is 51.5° for the cone half angle of 30° is preferred, fabrication of the vee groove at a half angle of a standard 45° was more economical than fabricating the vee groove at the optimum half angle of 51.4°.

During the registration sequence, as described in connection with FIGS. 22 to 24, the cone and its associated alignment pin initially contact and a sliding action of the pin along the cone would occur until the alignment pin is seated within the cone shaped surface as illustrated in FIG. 20.

At the time that the spherical end of the alignment pin 142 slides relative to the cone 152, the friction which exists between the alignment pin and the cone will retard the sliding action therebetween. If the friction coefficient is sufficiently high to completely retard the sliding action, the alignment pin and cone will not slide relative to each other and misregistration will occur. If the sequence utilized in attempting to obtain accurate registration results in either one or both of the vee groove and the flat surface contacting or engaging their respective alignment pins prior to the full engagement of the alignment pin 142 relative of the cone 152, the sliding action which is required between the alignment pin and the cone relative to each other must also impart relative movement and sliding action between the vee groove and its associated pin and/or the flat surface and its associated pin. In such event, any friction which exists between the vee groove and its associated pin and/or the planar surface and its associated pin would additionally retard the sliding action of the alignment pin in the cone. Thus, if the sum of the friction which must be overcome in order to provide relative movement between the alignment pin and the cone together with the sum of the friction which must be overcome to cause relative movement between the vee groove and its associated pin and/or the planar surface and its associated pin is too high, relative movement will not occur between any of the alignment pins and their associated cone, vee groove or flat which would result in misregistration. In operation, if a registration sequence is utilized wherein any one or both of the vee groove or planar surface is placed in initial contact with its associated alignment pin before full engagement is made between the alignment pin 142 and the cone 152, the maximum resultant coefficient of friction which can exist in order to allow relative movement between each of the alignment pins and its associated cone, vee groove and flat surface must be lower, in the aggregrate, then the magnitude of the coefficient of friction that any one individual reference registration member may have to achieve registration of the alignment pins to its appropriate reference registration member in order to achieve the registration between each of the alignment pins and its associated cone, vee groove and planar surface when considered as an independent alignment operation or when using the preferred engagement sequence. The coefficients of friction which are required to meet this criteria and result in registration wherein sequences other than in the preferred sequence are used, are such low values that the same may not be achievable in a vacuum without resorting to exotic or impractical materials such as diamond or sapphire.

Referring again to the preferred registration reference and after the alignment pin 142 is in full engagement with the cone 152, the next desired step of the sequence is to place the alignment pin 146 in initial contact with vee groove 154 and to have relative sliding movement occur therebetween to place the alignment pin 146 in full engagement with vee groove 154 as shown in FIG. 19 which is required for accurate registration.

In using the preferred registration sequence, the half angles of the vee groove and cone are selected to be sufficiently small to insure that the sliding actions will occur, overriding the friction to obtain the desired accurate registration between the alignment pins 142 and 146, cone 152 and vee groove 154.

Conversely, if the second step of the sequence utilized an initial contact between the alignment pin 144 and the planar surface 156, no sliding action would occur between the contact point on the end of the alignment pin 144 and the planar surface 156. The next step of the sequence would require that the alignment pin 146 engage the vee groove 154. In such event, the initial contact between the end of alignment pin 146 and vee groove 154 would probably be principally along one of the two sides defining the vee groove 154. In order to obtain the required final engagement of the alignment pin 146 in the vee groove 154 as shown in FIG. 19, and the overall engagement of all of the alignment pins as shown in FIG. 24, sliding action must occur between the spherical end of the alignment pin 146 and the vee groove 154. The sliding action will occur only if the angle of the vee groove 154 is sufficiently steep to override the combination of the frictional force developed between the spherical end of the alignment pin 146 and the surface of the side defining the vee groove 154 plus the frictional force developed by the contact point of the alignment pin 144 sliding relative to planar surface 156.

Another feature of the cone 152, vee groove 154 and planar surface 156 construction is that when the first member and second member are exposed to an environment having high temperature, which are typically encountered in a vacuum deposition process, either or both members may experience thermal expansion and contraction which are compensated by the vee groove 154 and planar surface 156 points of engagement being unconstrained to permit the expansion and contraction to occur while maintaining an accurate and unique registration between the members.

In the preferred sequence, the drag action on the registering of alignment pin 146 into the vee groove 154 produced by alignment pin 142 rotating in cone 152 as alignment pin 146 slides on the vee groove will be a very small moment which will represent an insignificant drag on the registering process. The insignificant magnitude of this drag results from the very small radius of the contact circle of the spherical end of alignment pin 142 in the cone 152 as compared to the distance between alignment pins 142 and 146. Likewise, a similar insignificant drag due to the pivoting of alignment pins 142 and 146 in the cone 152 and vee groove 154, respectively, will occur as the first member and second member pivot relative to each other about the line of rotation 284 as alignment pin 144 is being engaged with the flat planar surface 156, as illustrated in FIG. 24.

Thus, is is apparent that the optimum angle relationship between the vee groove and cone as described hereinabove will help to insure accurate registration independent of the registration sequence. If the preferred registration sequence is used as described in connection with FIGS. 22 to 24, the angles of the vee groove and cone may be different because of the reduced friction/drag interactions which are eliminated by the alignment pin and reference registration member contacting sequence.

If the teachings of this invention are utilized in an ambient atmosphere and the coefficient of frictions do not become a major problem as they do in a vacuum, the sequence may then not be as significant in that an adequately low coefficient of friction can usually be achieved at ambient temperatures depending on the application.

Also, it is envisioned that certain applications may be available where the surfaces of both the alignment pins and the reference registration members can be provided with a lubricant such that the coefficient of friction is at a very low level and that the sequence of the loading need not be followed to overcome the coefficient of friction problem which would otherwise be present.

It is envisioned that the teachings of the invention could have a wide range of applications such as in a mask substrate alignment apparatus used in a vacuum deposition system, sputtering system or the like. In systems where the alignment must occur in a vacuum, the loading sequence is one method of overcoming the adverse effects which friction imposes upon members contacting and sliding relative to each other in a vacuum.

It is also envisioned that the teachings of this invention could be utilized in a number of applications such as for example, in machining precise parts, and aligning a first member relative to a second member or possibly even in the dental articulation art.

What is claimed is:

1. Apparatus for accurately registering a reference member in interdependent loading relationship at a predetermined spacing and position relative to one of a plurality of moveable members comprising
    means for supporting a plurality of moveable members each of which has a selected number of prealigned registration members which are located therein in a predetermined pattern, and with axes thereof substantially perpendicular to a selected plane, said supporting means being adapted to transport each of said moveable members including its associated prealigned registration members along a predetermined path to a working station;
    means for supporting a reference member at a said working station in spaced opposed relationship to a said moveable member located at a said working station with said prealigned registration members thereof positioned towards said reference member supporting means; and
    reference registration members, equal in number to the selected number of prealigned registration members, located on at least one of said reference member supporting means and a reference member and positioned thereon in substantially said predetermined pattern and which are adapted to co-act with said prealigned registration members when loaded thereagainst and being adapted to accurately register the reference member supporting means including a said reference member at a predetermined spacing and position relative to said moveable member located at said working station.

2. The Apparatus of claim 1 wherein said selected number of prealigned registration members comprise three prealigned registration members operatively coupled to each of said moveable members, said three prealigned registration members each including an elongated member positioned in said predetermined pattern on and extending from said moveable member with the axis of each of said elongated members extending from said moveable member and substantially perpendicular to said selected plane, one of said elongated members being adapted to be mounted on a said moveable member with the one of said elongated members axis positioned to intersect said selected plane at a point within said selected plane to define a primary registration point, one of said two other elongated members being adapted to be mounted on a said moveable member with said one of said two other elongated members axis positioned to intersect said selected plane at a point other than at said primary reference point to define a secondary reference point, said primary reference point and said secondary reference point defining a line located within said selected plane, the other of said two elongated members being adapted to be fixedly mounted on a said moveable member with the said other of said two elongated members axis intersecting said selected plane at a fixed point located at a point other than on said line to define a tertiary reference point, said tertiary reference point and said line defining a plane which is coplanar with said selected plane; and wherein said equal number of reference registration members comprise three reference registration members operatively coupled to at least one of said reference member supporting means and a said reference member which it to be accurately registered in an operative relationship to a said moveable member, each of said reference registration members including an elongated member receiving member adapted to be positioned thereon and fixedly affixed thereto in substantially said predetermined pattern;

each of said reference registration members being adapted to receive said prealigned registration member when a said reference member and a said moveable member are loaded against each other enabling the elongated member receiving member to co-act with said elongated member to accurately register a said reference member at a predetermined spacing and position relative to a said moveable member.

3. The apparatus of claim 2 wherein each of said elongated members has a preselected axial length and each of the elongated receiving members has a preselected depth of engagement with its associated elongated member which co-acts therewith to establish a predetermined spacing and position when a said reference member is accurately registered in an interdependent relationship to said moveable member.

4. The apparatus of claim 3 wherein at least one of the elongated members' preselected axial length is established by use of at least one shim having a known axial thickness.

5. The apparatus of claim 2 wherein said reference member is a substrate and said moveable members are deposition masks having deposition patterns formed therein.

* * * * *